United States Patent [19]
Peidous

[11] Patent Number: 5,937,297
[45] Date of Patent: Aug. 10, 1999

[54] METHOD FOR MAKING SUB-QUARTER-MICRON MOSFET

[75] Inventor: Igor V. Peidous, Singapore, Singapore

[73] Assignee: Chartered Semiconductor Manufacturing, Ltd., Singapore, Singapore

[21] Appl. No.: 09/088,440

[22] Filed: Jun. 2, 1998

[51] Int. Cl.$^6$ ............................................... H01L 21/336
[52] U.S. Cl. .................. 438/270; 438/221; 438/259; 438/275; 438/289
[58] Field of Search .................... 438/199, 221, 438/259, 270, 275, FOR 163, FOR 168, FOR 216, FOR 217, FOR 218, FOR 172, FOR 177, FOR 197, 289

[56] References Cited

U.S. PATENT DOCUMENTS

| | | | |
|---|---|---|---|
| 5,017,504 | 5/1991 | Nishimura et al. | 437/40 |
| 5,108,937 | 4/1992 | Tsai et al. | 437/40 |
| 5,270,257 | 12/1993 | Shin | 437/203 |
| 5,371,024 | 12/1994 | Hieda et al. | 437/40 |
| 5,434,093 | 7/1995 | Chau et al. | 437/41 |
| 5,464,780 | 11/1995 | Yamazaki | 437/41 |
| 5,514,604 | 5/1996 | Brown | 437/40 |
| 5,527,720 | 6/1996 | Goodyear et al. | 437/29 |
| 5,532,179 | 7/1996 | Chang et al. | 437/40 |
| 5,538,913 | 7/1996 | Hong | 437/44 |
| 5,623,153 | 4/1997 | Liang et al. | 257/336 |
| 5,705,409 | 1/1998 | Witek | 437/35 |

FOREIGN PATENT DOCUMENTS

| | | | |
|---|---|---|---|
| 404074417 | 3/1992 | Japan | 438/172 |

Primary Examiner—Michael Trinh
Assistant Examiner—Long Pham
Attorney, Agent, or Firm—George O. Saile; Stephen B. Ackerman; Rosemary L. S. Pike

[57] ABSTRACT

A method for forming a sub-quarter micron MOSFET having an LDD structure is described. An active area is provided in a semiconductor substrate separated from other active areas by isolation regions. Ions are implanted into the semiconductor substrate in the active area wherein a heavily doped region is formed adjacent to the surface of the semiconductor substrate and wherein a lightly doped region is formed underlying the heavily doped region. A first dielectric layer is deposited overlying the semiconductor substrate in the active area. The first dielectric layer is etched away to form an opening to the semiconductor substrate. The semiconductor substrate within the opening is etched through to form a partial trench in the semiconductor substrate. Spacers are formed on the sidewalls of the first dielectric layer within the opening. A layer of conducting material is deposited over the first dielectric layer and the spacers and within the opening. The conducting material is etched to form a gate electrode to complete the fabrication of the integrated circuit device.

27 Claims, 6 Drawing Sheets

METHOD FOR MAKING SUB-QUARTER-MICRON MOSFET

BACKGROUND OF THE INVENTION (1) Field of the Invention

The invention relates to the fabrication of integrated circuit devices, and more particularly, to a method of forming a sub-quarter-micron MOSFET structure in the fabrication of integrated circuits.

(2) Description of the Prior Art

In sub-quarter-micron MOSFET architecture, it is necessary to use ultra-shallow source/drain regions. Low energy ion implantation is typically used for the formation of such regions. However, problems occur with these devices. So-called "Gerhard Hobler effects," caused by lateral doping variations are an issue for these devices.

Figure 1:
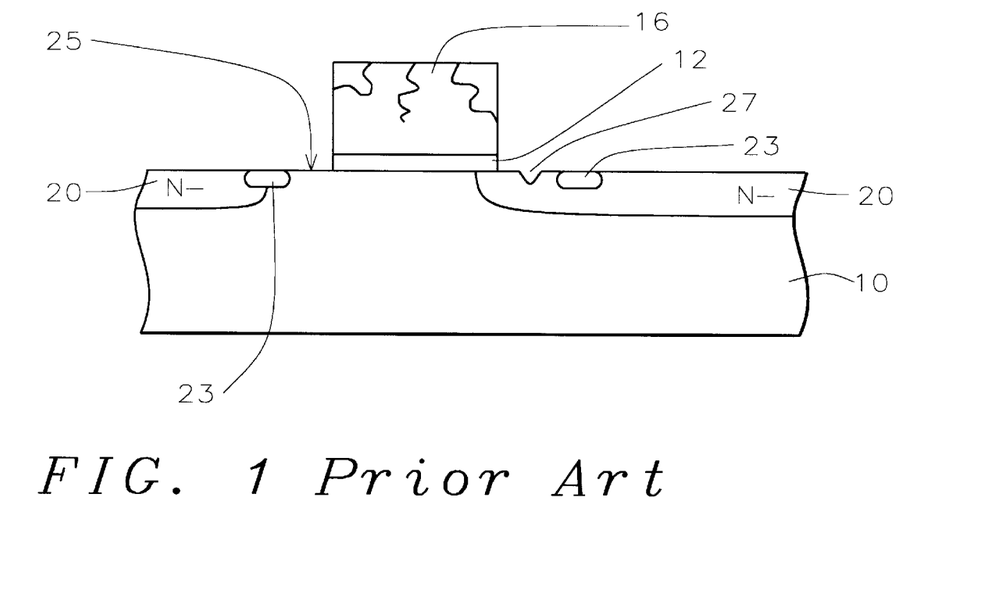
FIG. 1 schematically illustrates in cross-sectional representation a MOSFET having an LDD structure of the prior art.

For example, FIG. 1 illustrates a semiconductor substrate 10, preferably composed of monocrystalline silicon. A layer of silicon oxide 12 is formed on the surface of the substrate. A polysilicon layer is deposited and patterned to form gate electrode 16. A typical LDD (lightly doped source and drain) structure is formed by an LDD mask implant followed by spacer oxide deposition and etching and then a source/drain mask implant. Lightly doped source and drain regions 20 are shown in FIG. 1.

FIG. 1 illustrates "hot spots" 23 in the lightly doped source/drain regions which cause current leakage. These "hot spots" are formed as a result of the interaction of relatively low energy ions with the sidewall of the gate.

Source/drain lateral misalignment with the gate, seen at 25 where there is a gap between the source/drain region 20 and the gate edge, is the origin for the device subthreshold characteristics variations. The conditions for the conducting channel onset for the gap 25 region are different from those for the under-the-gate regions. Therefore, not only subthreshold, but also threshold characteristics would depend on the gap width. These variations also cause enhanced hot carrier injection and gate degradation resulting in a decrease in the reliability level of the device.

Micro-trenches, such as 27, may occur during gate etching. These micro-trenches cause nucleation of crystal defects and thus, excessive leakage currents. They also cause a doping profile non-uniformity and hence an increase in standby currents of the transistor and threshold characteristics variation, such as in saturation current.

Gate critical dimension (CD) reproducibility has been a concern of all of the sub-micron technologies. Minimum gate length corresponds to the minimum feature size of any technology generation; that is, the edge of a lithography tool capability. Therefore, considerable relative variations of a gate CD are inevitable. At the same time, device characteristics strongly depend on the gate length.

U.S. Pat. No. 5,538,913 to Hong teaches forming a gate electrode in a trench wherein conducting spacers form part of the gate. U.S. Pat. No. 5,270,257 to Shin teaches forming a gate electrode in a trench and growing an epitaxial N+ layer over an implanted N− layer. U.S. Pat. No. 5,464,780 to Yamazaki discloses the fabrication of gate electrodes at the side surfaces of a trench in the fabrication of a memory cell. U.S. Pat. No. 5,108,937 to Tsai et al teaches removing a field oxide region and forming a gate electrode in the depression left by the field oxide region. U.S. Pat. No. 5,623,153 to Liang et al shows the formation of a gate electrode and formation of N− and N+ regions by outdiffusion from doped pad oxide and doped polysilicon layers, respectively.

SUMMARY OF THE INVENTION

A principal object of the present invention is to provide an effective and very manufacturable method of forming a MOSFET having an LDD structure.

A further object of the invention is to provide a method of forming a sub-quarter micron MOSFET having an LDD structure wherein hot spots are avoided.

Yet another object is to provide a method of forming a sub-quarter micron MOSFET having an LDD structure wherein source/drain lateral misalignment with the gate is avoided.

Yet another object is to provide a method of forming a sub-quarter micron MOSFET having an LDD structure wherein micro-trenches are not formed during gate layer patterning.

In accordance with the objects of this invention a method for forming a sub-quarter micron MOSFET having an LDD structure is achieved. An active area is provided in a semiconductor substrate separated from other active areas by isolation regions. Ions are implanted into the semiconductor substrate in the active area wherein a heavily doped region is formed adjacent to the surface of the semiconductor substrate and wherein a lightly doped region is formed underlying the heavily doped region. A first dielectric layer is deposited overlying the semiconductor substrate in the active area. The first dielectric layer is etched away to form an opening to the semiconductor substrate. The semiconductor substrate within the opening is etched through to form a partial trench in the semiconductor substrate. Spacers are formed on the sidewalls of the first dielectric layer within the opening. A layer of conducting material is deposited over the first dielectric layer and the spacers and within the opening. The conducting material is etched to form a gate electrode to complete the fabrication of the integrated circuit device.

Also in accordance with the objects of the present invention, a MOSFET integrated circuit device is achieved. An active area in a semiconductor substrate is separated from other active areas by isolation regions. A gate electrode in the active area lies on the surface of the semiconductor substrate and partially penetrating the surface of the semiconductor substrate. A dielectric layer lies on the surface of the semiconductor substrate. Dielectric spacers lie on the sidewalls of the dielectric layer wherein the dielectric spacers surround the gate electrode. Heavily doped source and drain regions underlie the dielectric layer adjacent to the surface of the semiconductor substrate and separated from the gate electrode by the spacers. Lightly doped regions underlie the heavily doped regions, the spacers, and the gate electrode to complete the MOSFET integrated circuit device.

BRIEF DESCRIPTION OF THE DRAWINGS

In the accompanying drawings forming a material part of this description, there is shown:

FIGS. 2 through 10 schematically illustrate in cross-sectional representation a preferred embodiment of the present invention.

DESCRIPTION OF THE PREFERRED EMBODIMENTS

Figure 2:
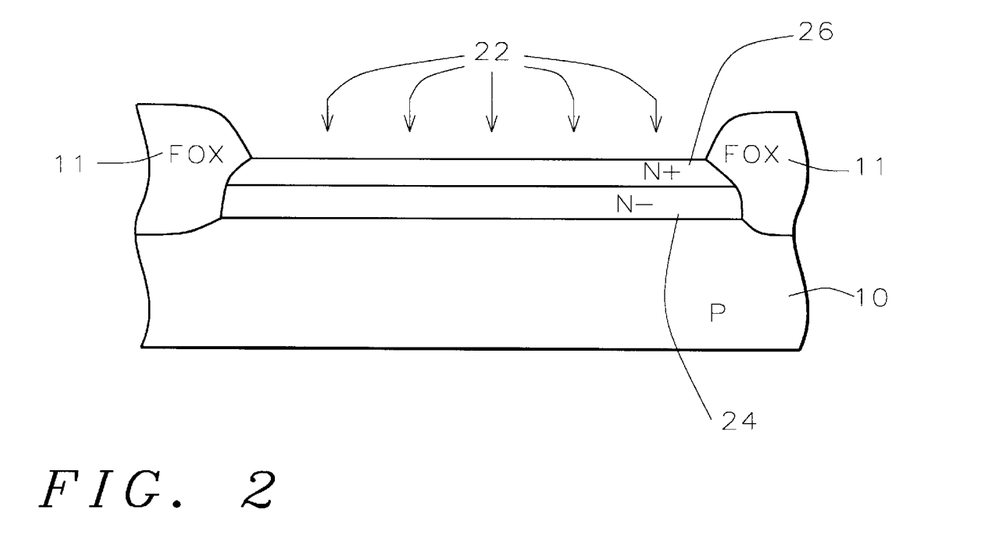

Referring now more particularly to FIG. 2, there is shown an illustration of a portion of a partially completed metal oxide field effect transistor (MOSFET). The semiconductor substrate 10 is preferably composed of silicon having a (100) crystallographic orientation and has been doped to be a p-type substrate. It will be understood by those skilled in the art that while FIGS. 2 through 10 illustrate an N channel MOSFET integrated circuit device, a P channel FET integrated circuit device could be formed simply by substituting opposite polarities to those given for the N channel embodiment. Also, in a similar way, a CMOSFET could be formed by making both N channel and P channel devices upon the same substrate.

In an effort to simplify the description and the drawings the dielectric isolation between devices has been only partially shown and will not be described in detail, because they are conventional. For example, Field OXide regions FOX 11 can be formed in and on the semiconductor substrate.

Ions 22 are implanted into the surface of the substrate to form lightly doped region 24 and heavily doped region 26. The heavily doped region is adjacent to the surface of the substrate and the lightly doped region is underlying the heavily doped region. These regions may be formed, for example, by the double diffused method. For example, the lightly doped region 24 may be formed by implanting ions into the substrate at an energy of 1 to 5 KeV and dosage of 1 E 14 to 5 E 14 atoms/cm$^2$. For NMOS, Arsenic ions are implanted while for PMOS, $BF_2$ ions are implanted. To form the heavily doped region 26, arsenic ions are implanted to form an NMOS region at an energy of 0.2 to 2 KeV and dosage of 2 E 15 to 6 E 15 atoms/cm$^2$. For a PMOS region, $BF_2$ ions are implanted at an energy of 0.5 to 1 KeV and dosage of 1 E 15 to 4 E 15 atoms/cm$^2$. The ions are driven in, for example, by a rapid thermal annealing (RTA) from 900° C. for 10 seconds for the shallowest source/drain to 1000° C. for 20 seconds for a deeper source/drain.

The blank implantation to form the source/drain regions used in the present invention eliminates the problems of the "Hobler effect" including the hot spots 23 and gaps 25, illustrated in FIG. 1.

Figure 3:
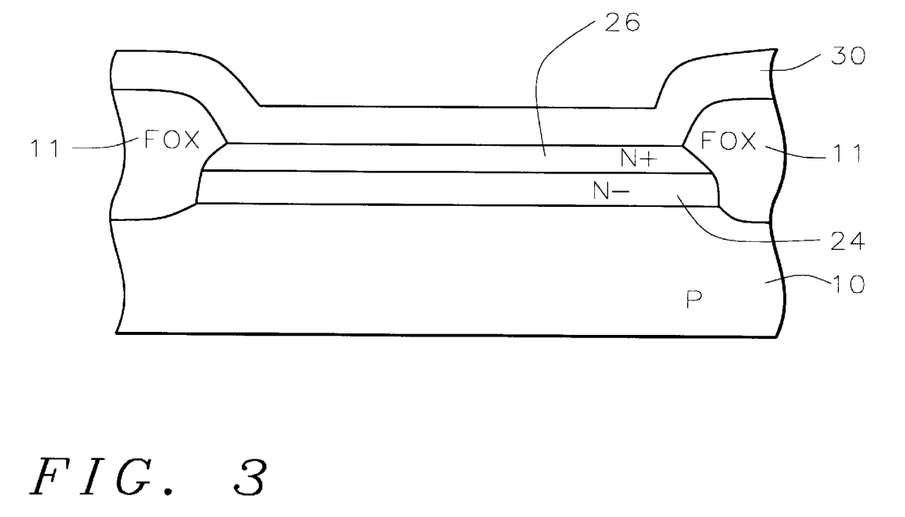

Next, referring to FIG. 3, dielectric layer 30 is deposited over the surface of the substrate to a thickness of between about 500 and 2000 Angstroms. This dielectric layer may comprise silicon dioxide and may be thermally grown or deposited by chemical vapor deposition (CVD) or by high density plasma CVD.

Figure 4:
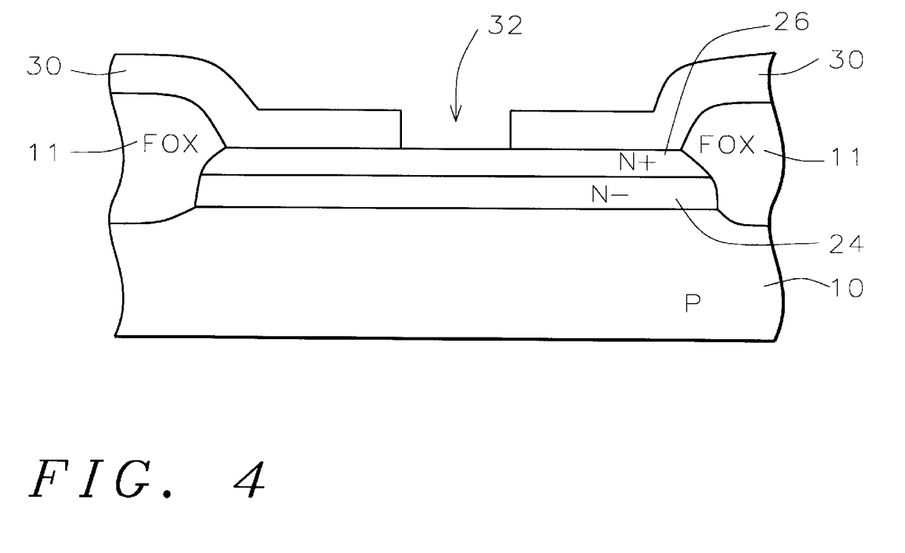
Figure 5:
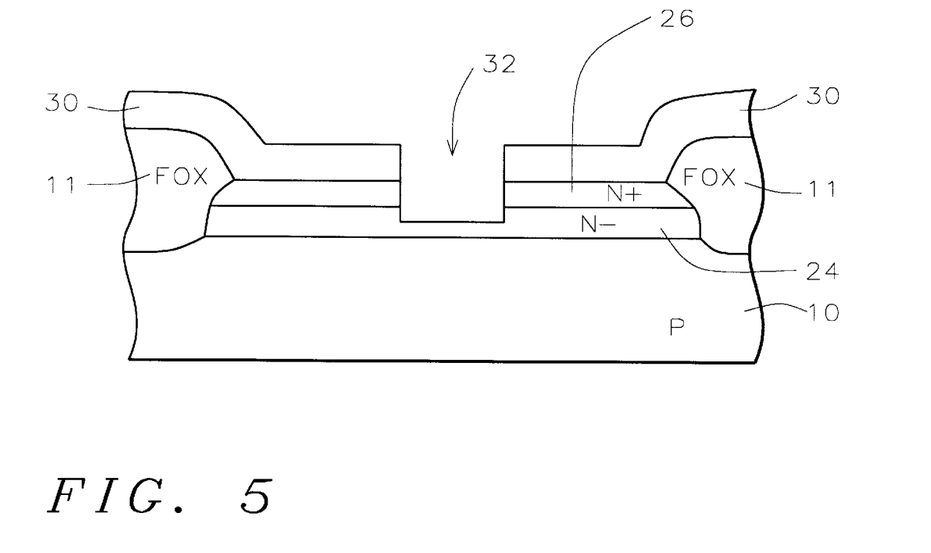

An opening 32 is etched in the dielectric layer 30 to the substrate, as shown in FIG. 4. This will provide a gate opening. The opening 32 is further etched into the semiconductor substrate to a depth of between about 500 Angstroms for the shallowest source/drain to 2000 Angstroms for a deeper source/drain. This is illustrated in FIG. 5.

Figure 6:
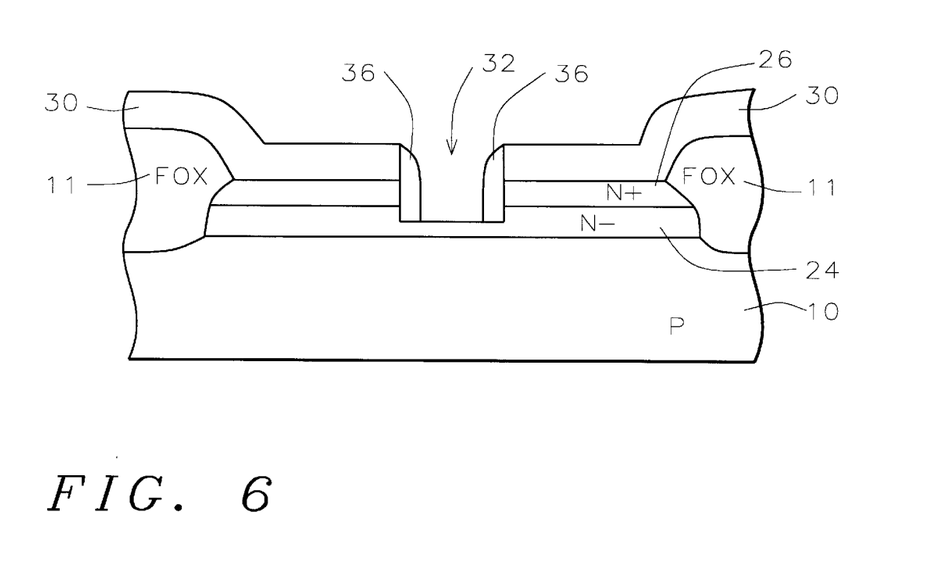

Referring now to FIG. 6, a second dielectric layer is deposited and anisotropically etched back to leave spacers 36 on the sidewalls of the first dielectric layer 30 within the gate opening 32. The spacers may comprise silicon dioxide or silicon nitride.

Figure 7:
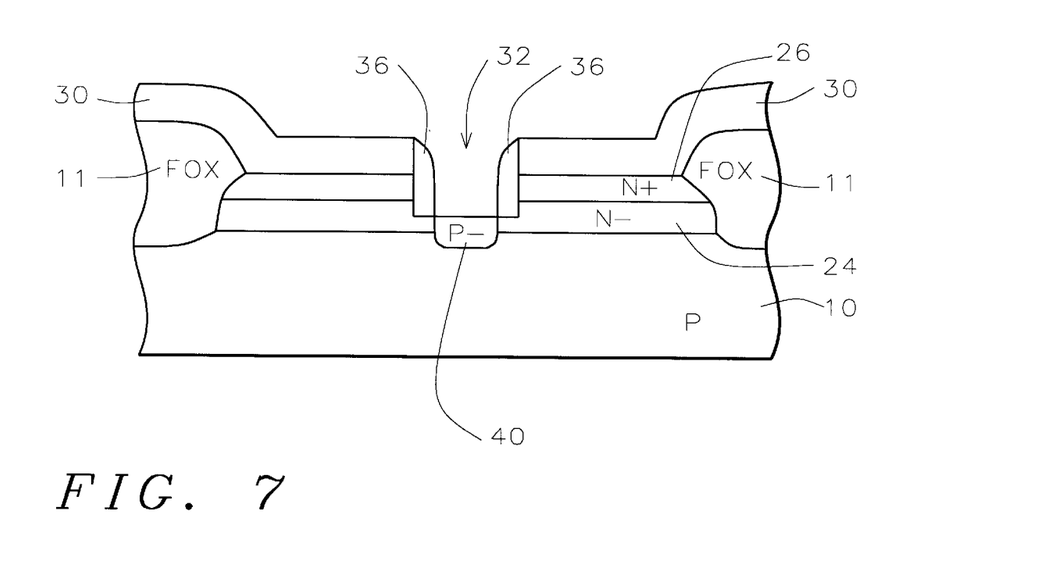

A P-threshold adjustment ion implantation is performed to form the P-region 40 in the substrate underlying the gate opening 32, as illustrated in FIG. 7.

Figure 8:
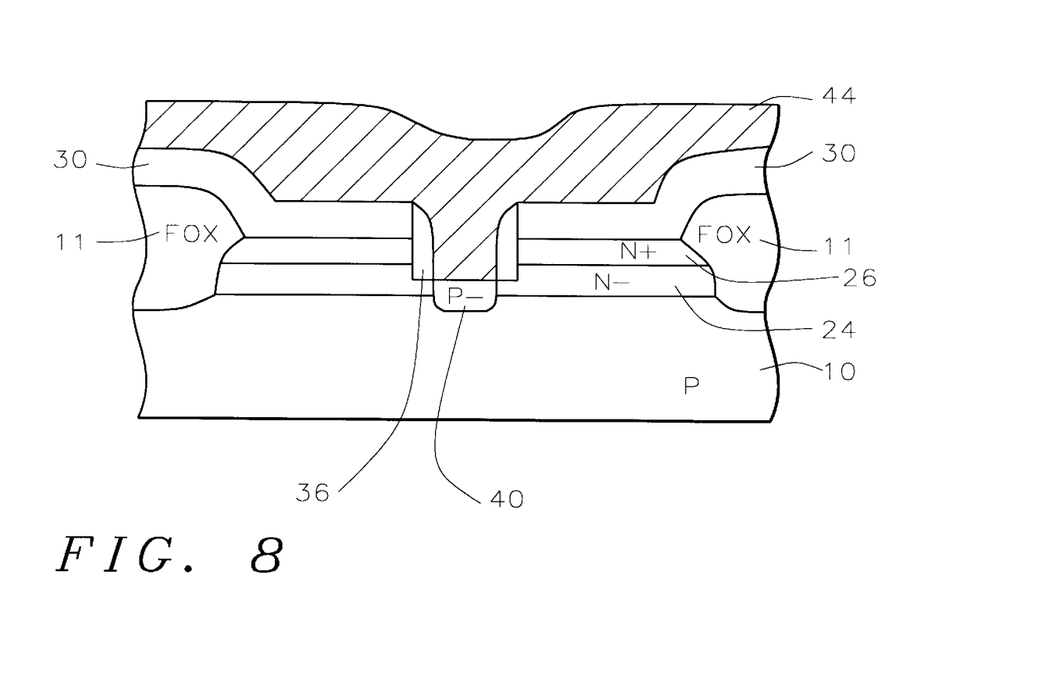

A gate material layer 44 is deposited, for example by low pressure chemical vapor deposition (LPCVD), to a thickness of between about 1000 to 2000 Angstroms, as shown in FIG. 8. The gate material may be polysilicon, doped silicon, or silicon germanium.

Figure 9A:
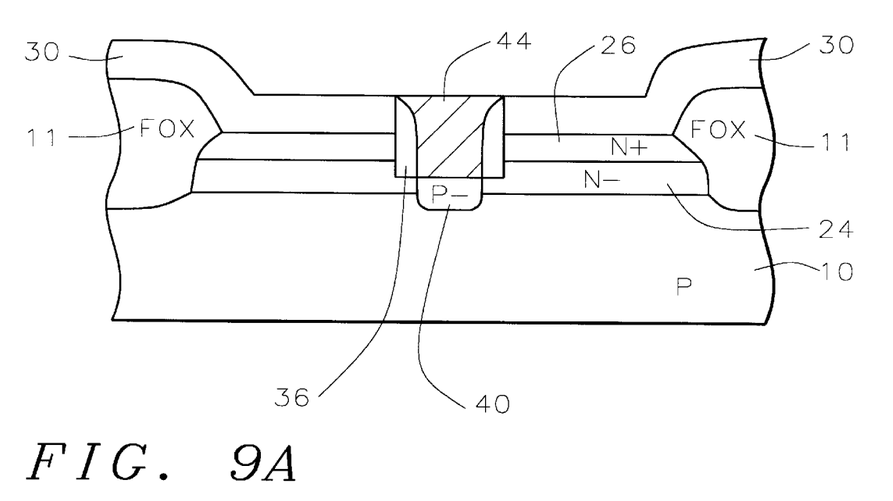
FIGS. 9A and 9B schematically illustrate in cross-sectional representation two alternative methods in a preferred embodiment of the present invention.
Figure 9B:
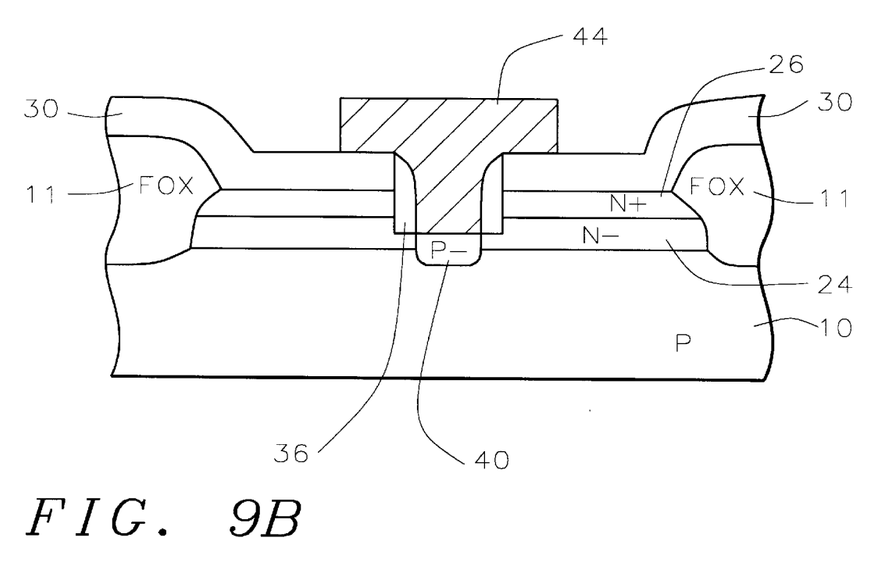

The gate may be formed by etching back the gate material layer 44 with an etch stop at the dielectric layer 30, as illustrated in FIG. 9A. Alternatively, the gate material layer 44 is etched away where it is not covered by a mask to form the gate electrode 44, as shown in FIG. 9B.

Because a recessed gate is formed, the micro-trenches 27 of FIG. 1 caused by gate etching are avoided in the process of the present invention. In the present invention, the gate length corresponds to the minimum lithography resolution R minus the spacer width (2S). The additional advantage of further device scaling is achieved.

A further advantage of the present invention is improved device performance. The capacitance formed by the gate electrode-gate dielectric-highly doped source/drain regions degrades device performance. In the process of the present invention, there is no gate to source/drain interaction through a thin gate oxide.

Figure 10:
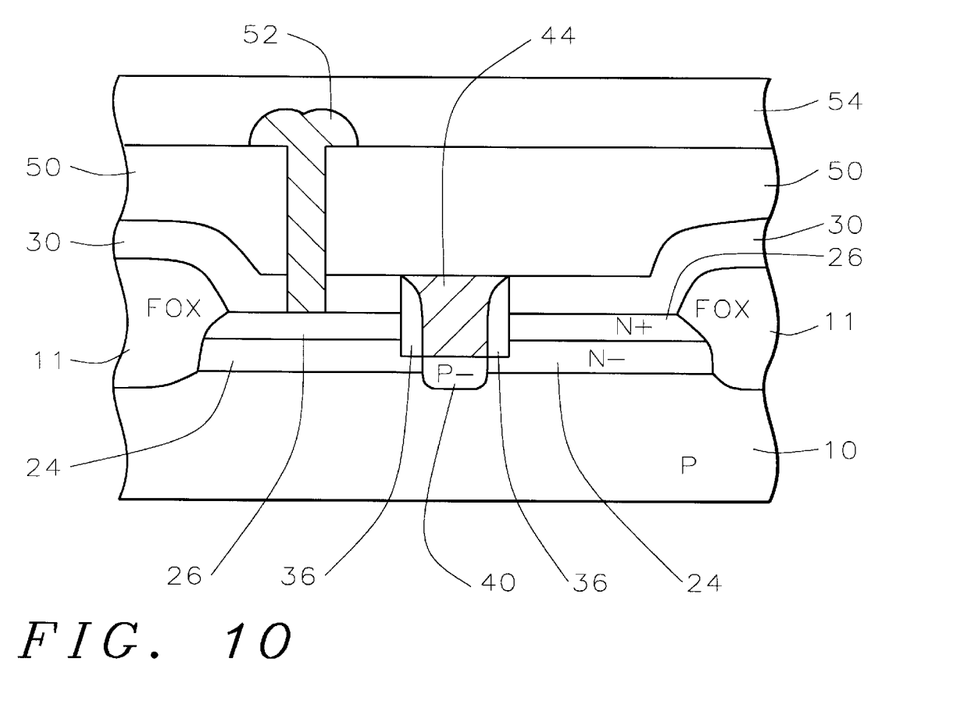

This completes the formation of the LDD structure. The integrated circuit device is completed as is conventional in the art. For example, as illustrated in FIG. 10, insulating layer 50 is deposited over the surface of the substrate. Contact openings are made through the insulating layer to the underlying semiconductor devices, such as to source region 26. A metal layer 52 is deposited and patterned to form electrical connections between the elements of the integrated circuit. A passivation layer 54 completes the fabrication of the integrated circuit.

The process of the invention provides a sub-quarter-micron MOSFET device with an LDD structure with enhanced reliability and freedom from current leakage and other lateral doping effects. The process of the invention utilizes a partially trenched gate electrode and fully overlapping LDD structure to provide the improved MOSFET of the invention.

Low energy implantation, which is preferred for sub-quarter-micron devices, produces extended deep "tails" presenting problems for device characteristics. However, a recessed gate such as in the present invention, may be as deep as the "tails" thereby providing the means for the desired device parameters to be achieved.

Referring now to FIG. 10, the sub-quarter-micron MOSFET device of the present invention will be described. An active area in a semiconductor substrate is separated from other active areas by isolation regions 11. A gate electrode 44 in the active area lies on the surface of the semiconductor substrate 10 and partially penetrating the surface of the semiconductor substrate. A dielectric layer 30 lies on the surface of the semiconductor substrate. Dielectric spacers 36 lie on the sidewalls of the dielectric layer wherein the dielectric spacers surround the gate electrode. Heavily doped source and drain regions 26 underlie the dielectric layer adjacent to the surface of the semiconductor substrate and separated from the gate electrode by the spacers 36. Lightly doped regions 24 underlie the heavily doped regions 26, the spacers 36, and the gate electrode 44. A threshold adjustment implant 40 underlies the gate electrode. A conducting line 52 extends through an insulating layer 50 and the dielectric layer 30 to contact the heavily doped region 26. A passivation layer 54 completes the integrated circuit device.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:

providing an active area in a semiconductor substrate separated from other active areas by isolation regions;

implanting first ions through a top surface of said semiconductor substrate in said active area wherein a heavily doped region is formed adjacent to said top surface of said semiconductor substrate and implanting second ions into said semiconductor substrate wherein a lightly doped region is formed underlying said heavily doped region;

depositing a first dielectric layer overlying said semiconductor substrate in said active area;

etching away said first dielectric layer to form an opening to said semiconductor substrate whereby said opening has sidewalls comprising said first dielectric layer;

etching into said semiconductor substrate within said opening to form a trench in said semiconductor substrate;

forming spacers on said sidewalls of said opening;

depositing a layer of conducting material over said first dielectric layer and said spacers and within said opening; and etching said conducting material to form a gate electrode within said opening to complete said method of fabricating said integrated circuit device.

2. The method according to claim 1 wherein said first dielectric layer comprises silicon dioxide and has a thickness of between about 500 and 3000 Angstroms.

3. The method according to claim 1 wherein said step of etching into said semiconductor substrate comprises etching completely through said heavily doped region and etching partially through said lightly doped region.

4. The method according to claim 1 wherein said spacers comprise silicon dioxide and have a width of between about 200 and 2000 Angstroms.

5. The method according to claim 1 wherein said spacers comprise silicon nitride and have a width of between about 200 and 2000 Angstroms.

6. The method according to claim 1 further comprising implanting a threshold adjustment region into said semiconductor substrate using said spacers as a mask before said step of depositing said conducting material.

7. The method according to claim 1 wherein said conducting material comprises polysilicon.

8. The method according to claim 1 wherein said conducting material comprises doped silicon.

9. The method according to claim 1 wherein said conducting material comprises silicon germanium.

10. The method according to claim 1 wherein said step of etching said conducting material comprises etching back said conducting material using said first dielectric layer as an etch stop.

11. The method according to claim 1 wherein said step of etching said conducting material comprises:

forming a photoresist mask over the surface of said conducting material layer; and etching away said conducting material where it is not covered by said photoresist mask to form said gate electrode.

12. A method of fabricating an integrated circuit device comprising:

providing an active area in a semiconductor substrate separated from other active areas by isolation regions;

implanting first ions through a top surface of said semiconductor substrate in said active area wherein a heavily doped region is formed adjacent to said top surface of said semiconductor substrate and implanting second ions into said semiconductor substrate wherein a lightly doped region is formed 10 underlying said heavily doped region;

depositing a first dielectric layer overlying said semiconductor substrate in said active area;

etching away said first dielectric layer to form an opening to said semiconductor substrate whereby said opening has sidewalls comprising said first dielectric layer;

etching into said semiconductor substrate within said opening to form a trench in said semiconductor substrate wherein said etching proceeds completely through said heavily doped region and partially through said lightly doped region and leaving a heavily doped region on either side of said opening;

forming spacers on said sidewalls of said opening;

depositing a layer of conducting material over said first dielectric layer and said spacers and within said opening; and etching said conducting material to form a gate electrode within said opening wherein said heavily doped regions on either side of said trench form source and drain regions associated with said gate electrode to complete said method of fabricating said integrated circuit device.

13. The method according to claim 12 wherein said first dielectric layer comprises silicon dioxide and has a thickness of between about 500 and 3000 Angstroms.

14. The method according to claim 12 wherein said spacers comprise silicon dioxide and have a width of between about 200 and 2000 Angstroms.

15. The method according to claim 12 wherein said spacers comprise silicon nitride and have a width of between about 200 and 2000 Angstroms.

16. The method according to claim 12 further comprising implanting a threshold adjustment region into said semiconductor substrate using said spacers as a mask before said step of depositing said conducting material.

17. The method according to claim 12 wherein said conducting material comprises one of the group containing polysilicon, doped silicon, and silicon germanium.

18. The method according to claim 12 wherein said step of etching said conducting material comprises etching back said conducting material using said first dielectric layer as an etch stop.

19. The method according to claim 12 wherein said step of etching said conducting material comprises:

forming a photoresist mask over the surface of said conducting material layer; and etching away said conducting material where it is not covered by said photoresist mask to form said gate electrode.

20. A method of fabricating an integrated circuit device comprising:

providing an active area in a semiconductor substrate separated from other active areas by isolation regions;

implanting first ions through a top surface of said semiconductor substrate in said active area wherein a heavily doped region is formed adjacent to said top surface of said semiconductor substrate and implanting second ions into said semiconductor substrate wherein a lightly doped region is formed underlying said heavily doped region;

depositing a first dielectric layer overlying said semiconductor substrate in said active area;

etching away said first dielectric layer to form an opening to said semiconductor substrate whereby said opening has sidewalls comprising said first dielectric layer;

etching into said semiconductor substrate within said opening to form a trench in said semiconductor substrate wherein said etching proceeds completely through said heavily doped region and partially through said lightly doped region and leaving a heavily doped region on either side of said opening;

forming spacers on said sidewalls of said opening;

implanting a threshold adjustment region into said semiconductor substrate using said spacers as a mask;

depositing a layer of conducting material over said first dielectric layer and said spacers and within said opening; and etching said conducting material to form a gate electrode within said opening using said first dielectric layer as an etch stop wherein said heavily doped regions on either side of said trench form source and drain regions associated with said gate electrode to complete said method of fabricating said integrated circuit device.

21. The method according to claim 20 wherein said first dielectric layer comprises silicon dioxide and has a thickness of between about 500 and 3000 Angstroms.

22. The method according to claim 20 wherein said spacers comprise silicon dioxide and have a width of between about 200 and 2000 Angstroms.

23. The method according to claim 20 wherein said spacers comprise silicon nitride and have a width of between about 200 and 2000 Angstroms.

24. The method according to claim 20 wherein said conducting material comprises one of the group containing polysilicon, doped silicon, and silicon germanium.

25. The method according to claim 20 wherein said step of etching said conducting material comprises:

forming a photoresist mask over the surface of said conducting material layer; and etching away said conducting material where it is not covered by said photoresist mask to form said gate electrode.

26. The method according to claim 20 wherein after said step of etching said conducting material, a top surface of said gate electrode is level with a top surface of said first dielectric layer.

27. The device according to claim 20 wherein after said step of etching said conducting material, a top surface of said gate electrode protrudes above a top surface of said first dielectric layer.

* * * * *

UNITED STATES PATENT AND TRADEMARK OFFICE
CERTIFICATE OF CORRECTION

PATENT NO. : 5,937,297
DATED : August 10, 1999
INVENTOR(S) : Igor V. Peidous

It is certified that error appears in the above-identified patent and that said Letters Patent is hereby corrected as shown below:

Title page,
Item [22], delete "JUN. 2, 1998", and replace with -- JUN. 1, 1998 --.

Signed and Sealed this

Twenty-seventh Day of November, 2001

Attest:

*Nicholas P. Godici*

NICHOLAS P. GODICI
*Attesting Officer*   *Acting Director of the United States Patent and Trademark Office*